(12) United States Patent
Li

(10) Patent No.: US 12,374,618 B2
(45) Date of Patent: Jul. 29, 2025

(54) DEVICE AND METHOD OF MANUFACTURING THE SAME

(71) Applicant: NANYA TECHNOLOGY CORPORATION, New Taipei (TW)

(72) Inventor: Wei Zhong Li, Taoyuan (TW)

(73) Assignee: NANYA TECHNOLOGY CORPORATION, New Taipel (TW)

( * ) Notice: Subject to any disclaimer, the term of this patent is extended or adjusted under 35 U.S.C. 154(b) by 474 days.

(21) Appl. No.: 18/048,858

(22) Filed: Oct. 24, 2022

(65) Prior Publication Data

US 2024/0136282 A1 Apr. 25, 2024
US 2024/0234307 A9 Jul. 11, 2024

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01)

(58) Field of Classification Search
CPC ........................... H01L 23/528; H01L 23/5226

USPC .......................................................... 257/774
See application file for complete search history.

(56) References Cited

U.S. PATENT DOCUMENTS 11,742,357 B2 * 8/2023 Song .................... G02F 1/13452
257/773

FOREIGN PATENT DOCUMENTS

TW 202238578 A 10/2022

* cited by examiner

*Primary Examiner* — Tu-Tu V Ho
(74) *Attorney, Agent, or Firm* — CKC & Partners Co., LLC

(57) ABSTRACT

The present disclosure provides a device including a first conductive line and a second conductive line. The first conductive line includes a first segment that extends along a first direction and has a first side forming a first angle smaller than the right angle with the first direction. The second conductive line includes a first segment deviating from the first direction with the first angle. The first segment of the second conductive line is separated from the first side of the first segment of the first conductive line by a first distance greater than or equal to a first design rule distance.

20 Claims, 6 Drawing Sheets

600

┌─────────────────────────────────────────────────────────┐
│ FORMING A FIRST CONDUCTIVE LINE THAT HAS A              │
│ SEGMENT EXTENDING ALONG A FIRST DIRECTION               │ ~601
│ AND AN END PORTION, IN WHICH THE END PORTION            │
│ HAS A SIDE EXTENDING ALONG A SECOND DIRECTION           │
└─────────────────────────────────────────────────────────┘
                            │
                            ▼
┌─────────────────────────────────────────────────────────┐
│ FORMING A SECOND CONDUCTIVE LINE THAT HAS               │ ~602
│ A SEGMENT EXTENDING ALONG THE SECOND DIRECTION          │
└─────────────────────────────────────────────────────────┘

Fig. 6

DEVICE AND METHOD OF MANUFACTURING THE SAME

BACKGROUND

Description of Related Art

With the rapidly developed technologies of Integrated circuits (ICs), ICs designed smaller and having more complicated circuits are produced. Increasing density of ICs results in benefits in terms of speed, functionality and cost, but causes increasingly difficult design and fabrication issues.

SUMMARY

One aspect of the present disclosure is to provide a device including a first conductive line and a second conductive line. The first conductive line includes a first segment that extends along a first direction and has a first side forming a first angle smaller than the right angle with the first direction. The second conductive line includes a first segment deviating from the first direction with the first angle. The first segment of the second conductive line is separated from the first side of the first segment of the first conductive line by a first distance greater than or equal to a first design rule distance.

Another aspect of the present disclosure is to provide a device including a first conductive line and a second conductive line. The first conductive line includes a first segment extending along a first direction and a first end portion. On a top view, the first end portion of the first conductive line has a first quadrilateral with a first side overlapping a first side of the first segment of the first conductive line, a second side and a third side. Each of the second and third sides of the first end portion of the first conductive line connects the first side of the first end portion of the first conductive line and forms a first angle, different from a right angle, with the first side of the first end portion respectively. A first segment of the second conductive line extends along the first direction. Each of a nearest pair of vertices of the first end portion of the first conductive line and a first end portion of the second conductive line respectively is separated from the other by a first distance greater than or equal to a first design rule distance.

Another aspect of the present disclosure is to provide a method of manufacturing a device. The method includes: forming a first conductive line that has a first segment and a first end portion, in which the first segment extends along a first direction and has a first side perpendicular to the first direction, and the first end portion has a second side overlapping the first side and a third side, in which the third side of the first end portion connects the second side, extends along a second direction and forms a first angle, different from the right angle, with the first direction; and forming a second conductive line including a first segment extending along the second direction, in which the first segment of the second conductive line is separated from the third side of the first end portion of the first conductive line by a first distance greater than or equal to a first design rule distance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method, in accordance with some embodiments of the present disclosure.

DETAILED DESCRIPTION

The spirit of the present disclosure will be discussed in the following drawings and detailed description, and those of ordinary skill in the art will be able to change and modify the teachings of the present disclosure without departing from the spirit and scope of the present disclosure.

It should be understood that, in this document and the following claims, when an element is referred to as being "connected" or "coupled" to another element, it can be directly connected or coupled to another element, or there may be an intervening component. In contrast, when an element is referred to as being "directly connected" or "directly coupled" to another element, there is no intervening element. In addition, "electrically connected" or "connected" may also be used to indicate that two or more elements cooperate or interact with each other.

It should be understood that, in this document and the following claims, the terms "first" and "second" are to describe the various elements. However, these elements should not be limited by these terms. These terms are used to distinguish one element from another. For example, a first element may be termed a second element. Similarly, a second element may be termed a first element without departing from the spirit and scope of the embodiments.

It should be understood that, in this document and the following claims, the terms "include," "comprise," "having" and "has/have" are used in an open-ended fashion, and thus should be interpreted to mean "include, but not limited to."

It should be understood that, in this document and the following claims, the term "and/or" includes any and all combinations of one or more of the associated listed items.

It should be understood that, in this document and the following claims, Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
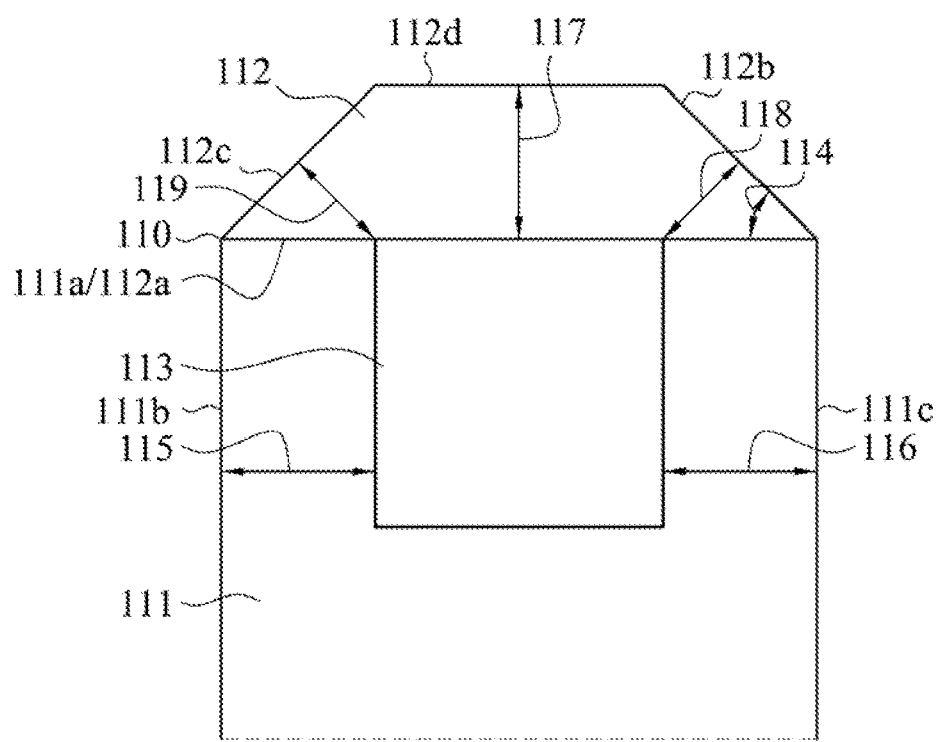
FIG. 1 is a schematic diagram of a device, in accordance with some embodiments of the present disclosure.
Figure 1:
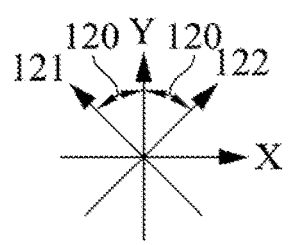

Reference is now made to FIG. 1. FIG. 1 is a schematic diagram of a device 100, in accordance with some embodiments of the present disclosure. For illustration, the device 100 includes a conductive line 110 and a via 113. As depicted in FIG. 1, the via 113 is disposed on the conductive line 110. In some embodiments, the conductive line 110 is a metal line of a metal layer of an integrated circuit (IC) and the via 113 is a via between metal layers of the IC.

As shown in FIG. 1, the conductive line 110 includes a segment 111 and an end portion 112. In some embodiments, the segment 111 has a shape of a rectangle with a side 111*a* along a direction x and sides 111*b*-111*c* along a direction y that is perpendicular to the direction x. The sides 111*b*-111*c* connect to ends of the side 111*a*. In some embodiments, the end portion 112 has a side 112*a* overlapping the side 111*a* of the segment 111 and has sides 112*b*-112*c*. Each of the side 112*b*-112*c* forms an angle 114 that is an acute angle with the side 112*a*, in which the side 112*b* is along a direction 121 deviating from the direction y with an angle 120 complementary to the angle 114, and the side 112*c* is along a direction 122 that is the other direction deviating from the direction y with the angle 120.

In some embodiments, sides 111*b*-111*c* of segment 111 is separated from the via 113 by distances 115-116 respectively. The distances 115-116 is greater than a design rule distance D1. In some embodiments, the design rule distance D1 ranges from about 5 nm to about 40 nm.

As shown in FIG. 1, the sides 112*b*-112*c* are separated from the via 113 by distances 118-119 greater than a design rule distance D2. In some embodiments, the design rule distance D2 ranges from about 5 nm to about 40 nm. In some embodiments, the end portion 112 is a quadrilateral that has a side 112*d* which is an opposite side of the side 112*a* of the end portion 112, wherein the side 112*a* overlaps the side 111*a* of the segment 111. As shown in FIG. 1, the side 112*d* is separated from the via 113 by a distance 117 greater than the design rule distance D1. In some embodiments, the design rule distance D1 is equal to the design rule distance D2.

The configurations of FIG. 1 are given for illustrative purposes. Various implements are within the contemplated scope of the present disclosure. For example, the distances 115-117 are greater than or equal to the design rule distance D1, and the distances 118-119 are greater than or equal to the design rule distance D2, according to some embodiments.

Figure 2:
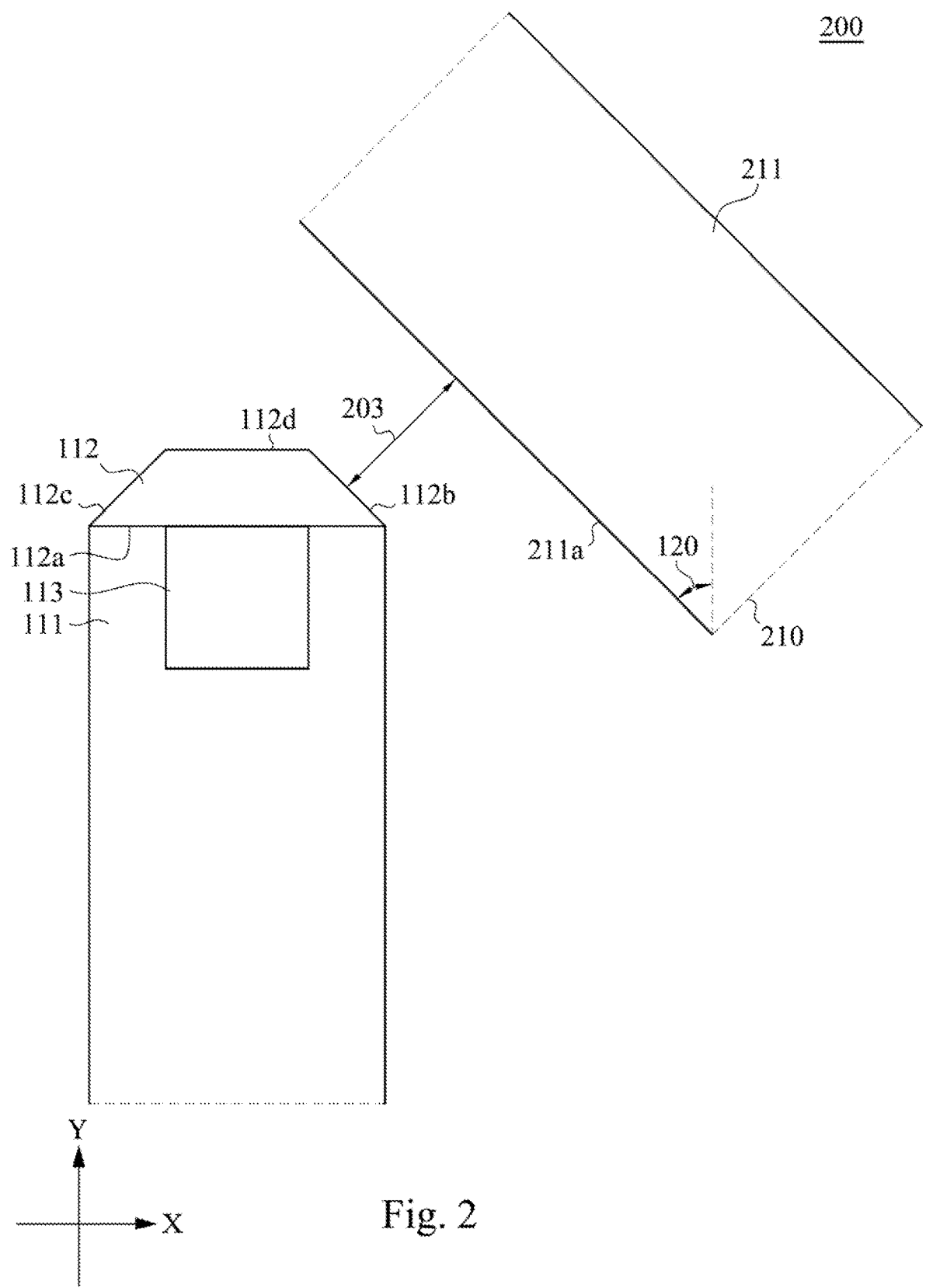
FIG. 2 is a schematic diagram of a device, in accordance with some embodiments of the present disclosure.

Reference is now made to FIG. 2. FIG. 2 is a schematic diagram of a device 200 in accordance with various embodiments. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2.

For illustration, compared to the device 100 shown in FIG. 1, the device 200 shown in FIG. 2 further includes a conductive line 210.

As shown in FIG. 2, the conductive line 210 includes a segment 211 parallel to the side 112*b*.

In some embodiments, the segment 111 extends along the direction y, and the side 112*b* and a side 211*a* of the segment 211 form the angle 120 which is an acute angle with the direction y respectively, as depicted in FIG. 2. In some embodiments, the side 112*b* and the side 211*a* are separated by a distance 203. In some embodiments, the distance 203 is greater than a design rule distance D3. In some embodiments, the design rule distance D3 ranges from about 50 nm to about 150 nm. In some embodiments, the design rule distance D3 is greater than the design rule distances D1 and D2.

Figure 3:
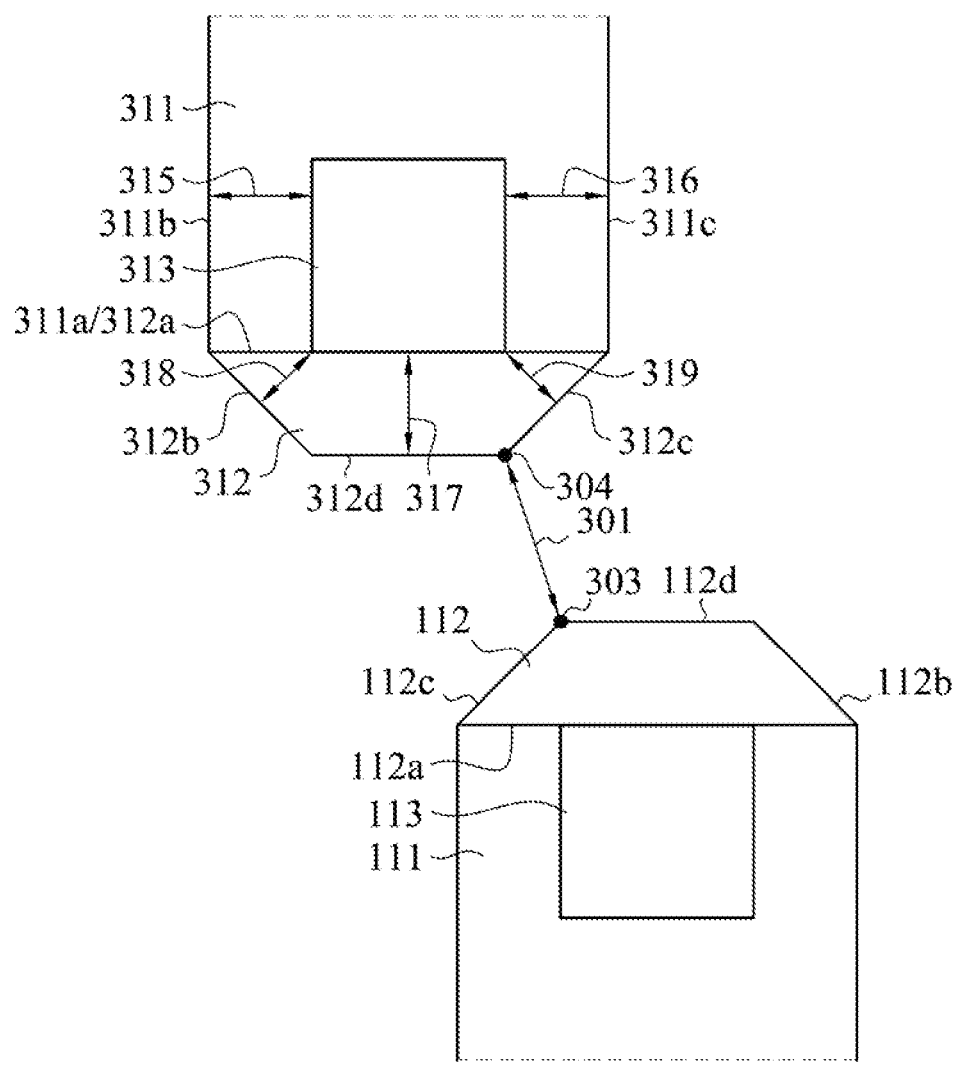
FIG. 3 is a schematic diagram of a device, in accordance with some embodiments of the present disclosure.
Figure 3:
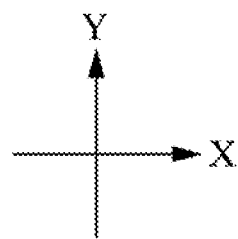

The configurations of FIG. 3 are given for illustrative purposes. Various implements are within the contemplated scope of the present disclosure. For example, the distance 203 is greater than or equal to the design rule distance D3, according to some embodiments.

Reference is now made to FIG. 3. FIG. 3 is a schematic diagram of a device 300 in accordance with various embodiments. With respect to the embodiments of FIGS. 1-2, like elements in FIG. 3 are designated with the same reference numbers for ease of understanding.

For illustration, compared to the device 100 shown in FIG. 1, the device 300 shown in FIG. 3 further includes a conductive line 310, separated from the conductive line 110 along the direction y, and a via 313. As depicted in FIG. 1, the via 313 is disposed on the conductive line 310.

As shown in FIG. 3, the conductive line 310 includes a segment 311 and an end portion 312. In some embodiments, the end portion 312 has a same shape of the quadrilateral of the end portion 112. For example, the end portion 312 has a shape of a quadrilateral with sides 312*a*-312*d* corresponding to the side 112*a*-112*d* of the quadrilateral of the end portion 112 as shown in FIG. 3. In some embodiments, the side 112*d* and side 312*d* are parallel, in which a nearest pair of vertices of the end portion 112 and the end portion 312, for example, a vertex 303 of the end portion 112 and a vertex 304 of the end portion 312, are separated from each other by a distance 301. In some embodiments, the distance 301 is greater than the design rule distance D3.

As shown in FIG. 3, sides 311*b*-311*c* of segment 311 is separated from the via 313 by distances 315-316 respectively, according to some embodiments. In some embodiments, the side 312*d* is separated from the via 313 by a distance 317. In some embodiments, the distances 315-317 is greater than the design rule distance D1. In some embodiments, the sides 312*b*-312*c* are separated from the via 113 by distances 318-319 greater than the design rule distance D2.

The configurations of FIG. 3 are given for illustrative purposes. Various implements are within the contemplated scope of the present disclosure. For example, the distances 301 is greater than or equal to the design rule distance D3, according to some embodiments.

Figure 4:
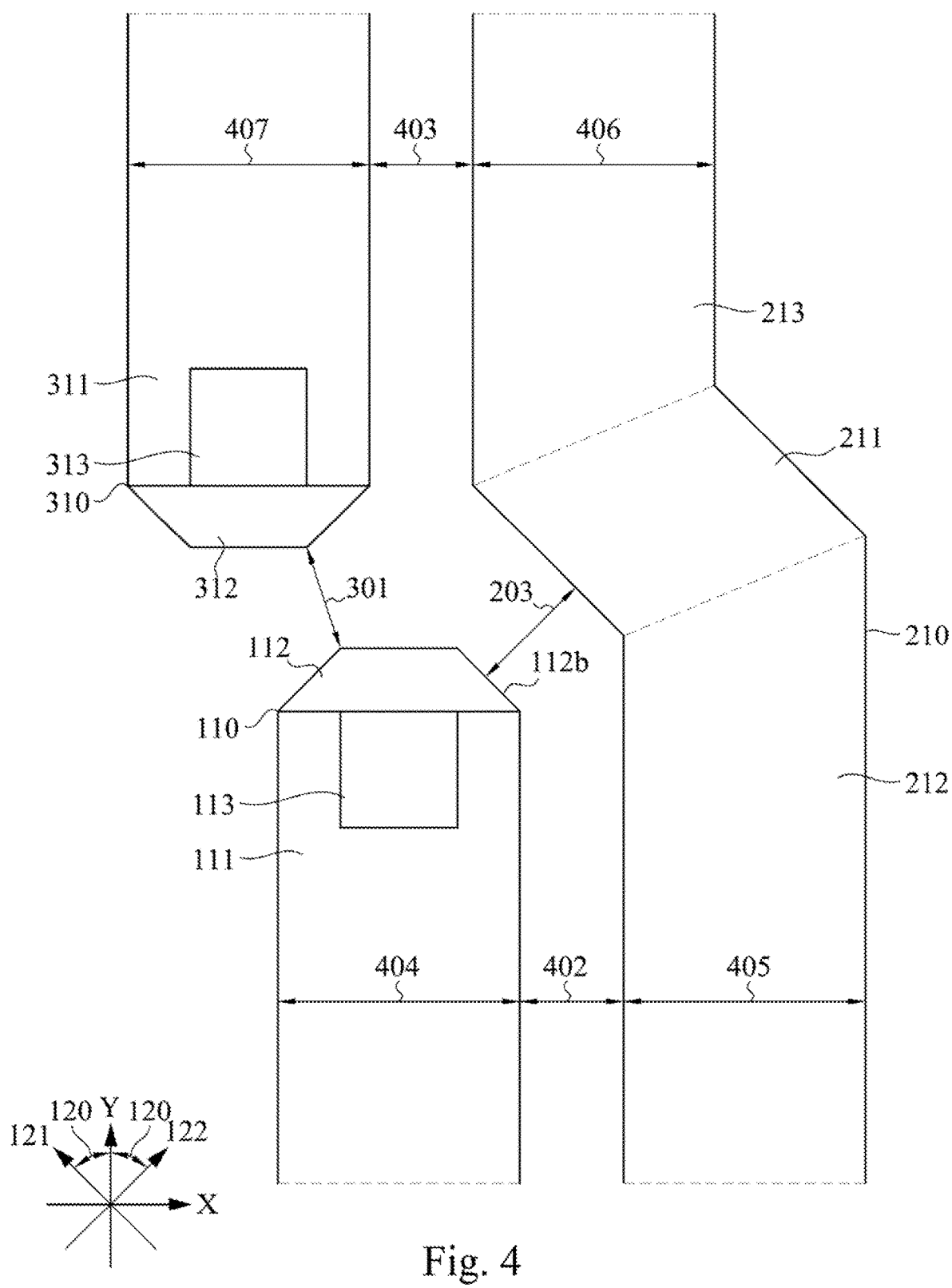
FIG. 4 is a schematic diagram of a device, in accordance with some embodiments of the present disclosure.

Reference is now made to FIG. 4. FIG. 4 is a schematic diagram of a device 400 in accordance with various embodiments. With respect to the embodiments of FIGS. 2-3, like elements in FIG. 4 are designated with the same reference numbers for ease of understanding.

For illustration, compared to the device 300 shown in FIG. 3, the device 400 shown in FIG. 4 further includes a conductive line 210' separated from the conductive line 110 and conductive line 310.

As shown in FIG. 4, compared to the conductive line 210 in FIG. 2, the conductive line 210' further includes segments 212-213. The segment 211 is a turning portion of the conductive line 210' while the segments 212-213 are not. Specifically, for example, the segments 212-213 extends along the direction y. The segment 211 is connected between the segments 212-213 and extends along a direction 121 that forms the angle 120 with the direction y. Alternatively stated, the side 112*b* and the segment 211 deviate from the direction y with a same angle, for example, the angle 120. In some embodiments, the angle 120 is less than 90 degree.

In some embodiments, each of the segments 111, 212-213 and 311 extends along the direction y, as depicted in FIG. 4. In some embodiments, the segment 111 is separated from the segment 212 along the direction x by a distance 402 and the segment 311 is separated from the segment 213 along the direction x by a distance 403. In some embodiments, each of the distances 402-403 is greater than the design rule distance D3.

I For illustration, the segments 111, 212-213 and 311 have widths 404-407 separately. In some embodiments, each of the widths 404-407 is greater than a design rule width W1.

In some embodiments, the widths 404-407 are equal to each other. In some embodiments, the design rule width W1 ranges about 50 nm to about 150 nm. In some embodiments, the design rule width W1 is equal to the design rule distance D3.

In some approaches, with regard to a fixed via on a conductive line end, in order to keep design rules of conductive line spacing (e.g., the design rule distance D3), a turning portion of another conductive line adjacent to the via would be allocated away from the via until the space between the two conductive lines is large enough.

Compared with some approaches, the present application utilizes a conductive line having an end portion with a side that deviates from a direction in which the conductive line extends. With such configurations, a distance between a via of a conductive line and a turning portion of another conductive line (e.g., the via 113 and the segment 211) could be shorten while keeping design rules of conductive line spacing. As a result, area arrangements of the IC is optimized for cutting the manufacture cost.

The configurations of FIG. 4 are given for illustrative purposes. Various implements are within the contemplated scope of the present disclosure. For example, each of widths 404-407 is greater than or equal to the design rule width W1, according to some embodiments.

Figure 5:
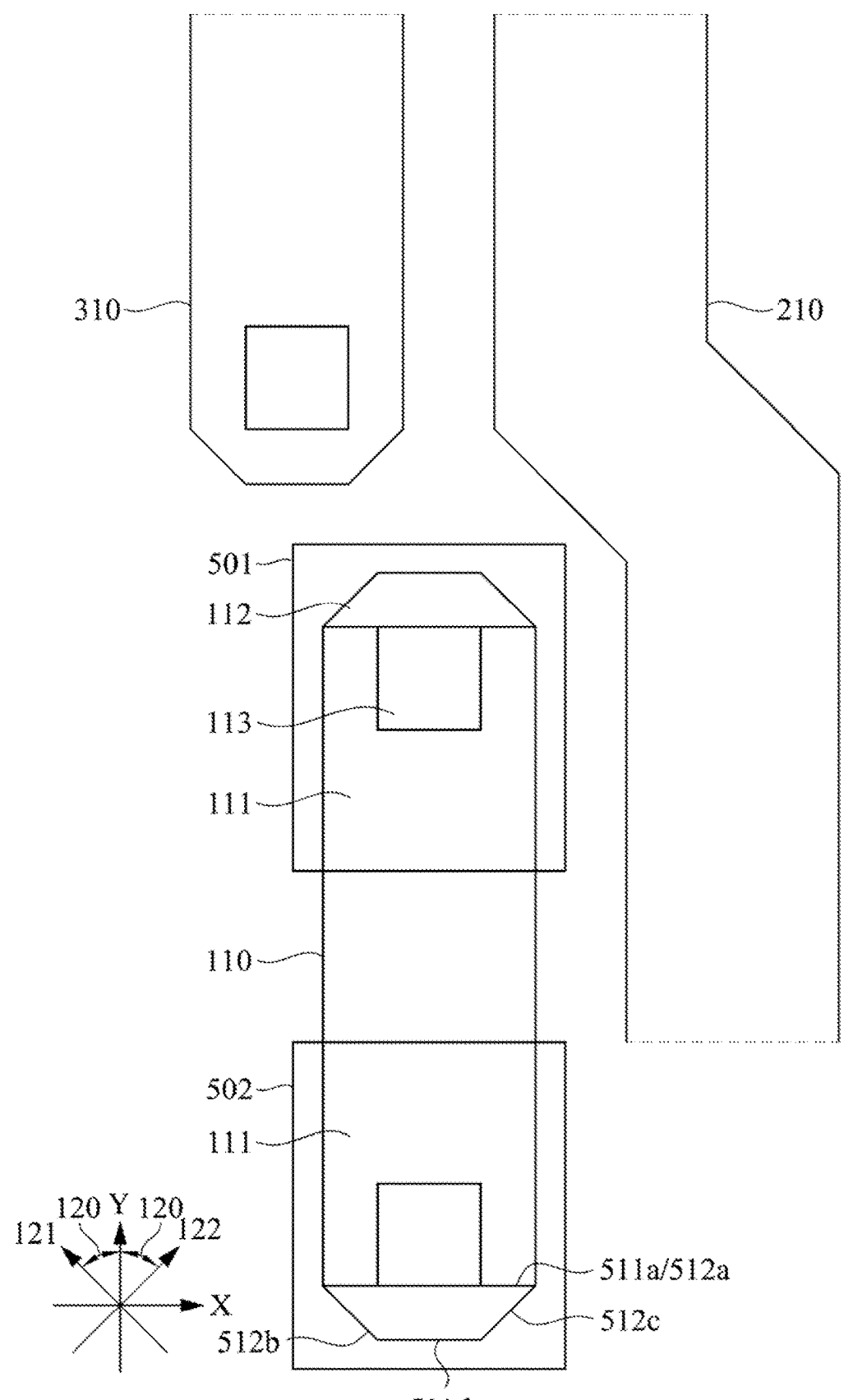
FIG. 5 is a schematic diagram of a device, in accordance with some embodiments of the present disclosure.

Reference is now made to FIG. 5. FIG. 5 is a schematic diagram of a device 500 in accordance with various embodiments. With respect to the embodiments of FIGS. 1-4, like elements in FIG. 5 are designated with the same reference numbers for ease of understanding.

For illustration, compared to the device 400 shown in FIG. 4, the device 500 shown in FIG. 5 further includes a segment 511 and an end portion 512.

In some embodiments, the end portion 512 has a side 512b along the direction 121, a side 512c along the direction 122 and a side 512d connecting the sides 512b-512c. In some embodiments, the end portion 512 has a shape of a quadrilateral that has a side 512a opposite to the side 512d.

For purpose of simplicity, the segment 511 and the end portion 512 together are hereinafter together referred to as a part 502. Likely, the segment 111 and the end portion 112 together are hereinafter together referred to as a part 501. In some embodiments, the parts 501 and 502 are symmetric with respect to the directions x and y.

Reference is now made to FIG. 6. FIG. 6 is a flowchart of a method 600, in accordance with some embodiments of the present disclosure. It is understood that additional operations can be provided before, during, and after the processes shown by FIG. 6, and some of the operations described below can be replaced or eliminated, for additional embodiments of the method 600. At least some operations in the method 600 can be utilized to manufacture devices, for example, devices 100-500 in FIG. 1-5. The method 600 includes operations 601-602 which would be discussed below.

In operation 601, the conductive line 110 that includes the segment 111 and the end portion 112 is formed. The segment 111 extends along the direction y and has the side 111a perpendicular to the direction y. The end portion 112 includes the side 112b and the side 112a overlapping the side 111a. The side 112b connects the side 112a, extends along the direction 121 and forms the angle 120 which is not the right angle with the first direction.

In some embodiments, as shown in FIG. 3, the method 600 further includes forming the conductive line 310 that has the first end portion 312, in which vertices 303-304 of the end portions 112 and 312 are separated from each other by the distance 301 greater than or equal to the design rule distance D3.

In some embodiments, as shown in FIG. 3, the method 600 further includes forming the via 113 arranged on the conductive line 110. The via 113 is separated from the side 112b by the distance 118 greater than or equal to the design rule distance D2.

In some embodiments, as shown in FIG. 5, the conductive line 110 further includes the segment 511 and the end portion 512. The segment 511 connects the segment 111, extends along the direction y and has the side 511a perpendicular to the direction y. The end portion 512 includes the side 512a and the side 512b. The side 512a overlaps the side 511a. The side 512b connects the side 512a, extending along the direction 121 and forms the angle 120 with the direction y.

In operation 602, the conductive line 210 that includes the segment 211 extending along the direction 121 is formed. The segment 211 is separated from the side 112b by the distance 203 which is greater than or equal to the design rule distance D3 as shown in FIG. 4.

In some embodiments, the conductive line 210 further includes the segment 212 and the segment 213. Each of the segments 212-213 extends along the direction y, in which the segment 211 connects the segments 212-213 together, as depicted in FIG. 4.

In some embodiments, as shown in FIG. 4, the method 600 further includes forming the conductive line 310 that has the segment 311 extending along the direction y. The segments 111 and 212 are the distance 402 apart, and the segments 311 and 213 are the distance 403 apart, in which the distances 402-403 are greater than or equal to the design rule distance D3.

As described above, the present disclosure provides a device and a method of manufacturing the same. With the configurations of the present disclosure, improvements in layout feasibility could be achieved. Moreover, a space between an end portion and a turning portion of separated conductive lines could be reduced without violating a design rule, and hence, a reduction of required area and cost for fabrication is provided.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A device, comprising:
   a first conductive line comprising a first segment that extends along a first direction and has a first side forming a first angle smaller than the right angle with the first direction; and
   a second conductive line comprising a first segment deviating from the first direction with the first angle, wherein the first segment of the second conductive line is separated from the first side of the first segment of the first conductive line by a first distance greater than or equal to a first design rule distance.

2. The device of claim 1, further comprising:
   a via arranged on the first segment, wherein the via and the first side are a second distance greater or equal to a second design rule distance apart, wherein the second design rule distance is smaller than the first design rule distance.

3. The device of claim 2, wherein the first segment has a second side different from the first side and is arranged the second distance apart from the via.

4. The device of claim 1, wherein the first side of the first segment of the first conductive line extends along a second direction,
wherein the first segment of the first conductive line has a second side extending along a third direction different from the second direction,
wherein the third direction forms the first angle with the first direction.

5. The device of claim 4, wherein the first conductive line further comprises a second segment that has a first side extending along the second direction, a second side extending along the third direction and a third side connecting the first and second sides of the second segment together.

6. The device of claim 4, further comprising:
a third conductive line having a first segment, wherein the first segment of the third conductive line has a first side extending along the second direction, a second side extending along the third direction and a third side connecting the first and second sides of the first segment of the third conductive line.

7. The device of claim 6, wherein a shortest distance between the first conductive line and the third conductive line is greater than or equal to the first design rule distance.

8. The device of claim 1, further comprising:
a third conductive line comprising a quadrilateral end and a line portion,
wherein the second conductive line comprises first and second segments that extend in the first direction and are coupled to the first segment of the second conductive line,
wherein the first segment of the first conductive line and the line portion of the third conductive line are separated from the first and second segments of the second conductive line by a second distance respectively, and
the second distance is greater than the first design rule distance.

9. A device, comprising:
a first conductive line comprising:
a first segment extending along a first direction; and
a first end portion, wherein on a top view, the first end portion of the first conductive line has a first quadrilateral with a first side overlapping a first side of the first segment of the first conductive line, a second side and a third side, wherein each of the second and third sides of the first end portion of the first conductive line connects the first side of the first end portion of the first conductive line and forms a first angle, different from a right angle, with the first side of the first end portion respectively; and
a second conductive line, wherein a first segment of the second conductive line extends along the first direction, and each of a nearest pair of vertices of the first end portion of the first conductive line and a first end portion of the second conductive line respectively is separated from the other by a first distance greater than or equal to a first design rule distance.

10. The device of claim 9, further comprising:
a third conductive line that has a first segment and a second segment that extend along the first direction,
wherein the first segment of the third conductive line and the first segment of the first conductive line are a second distance apart, and the second segment of the third conductive line and the first segment of the second conductive line are a third distance apart,
wherein the second and the third distance are greater than a design rule distance.

11. The device of claim 10, wherein a width of the first segment of the third conductive line and a width of the second segment of the third conductive line are greater than or equal to a first design rule width.

12. The device of claim 9, further comprising:
a third conductive line that has a first segment parallel to the third side of the first end portion of the first conductive line, wherein the first segment of the third conductive line is separated from the third side of the first end portion of the first conductive line by a second distance greater than or equal to the first design rule distance.

13. The device of claim 9, wherein on the top view, the first end portion of the second conductive line has a first quadrilateral with a first side overlapping a first side of the first segment of the second conductive line, a second side and a third side, wherein each of the second and third sides of the first end portion of the second conductive line connects the first side of the first end portion of the second conductive line and forms the first angle with the first side of the first end portion of the second conductive line.

14. The device of claim 13, further comprising:
a first via arranged on the first conductive line, wherein the first via is separated from the second and third sides of the first segment of the first conductive line respectively by a fourth distance greater than or equal to a second design rule distance; and
a second via arranged on the second conductive line, wherein the first via and the second and third sides of the first segment of the second conductive line respectively are the fourth distance apart.

15. A method of manufacturing a device, comprising:
forming a first conductive line that comprises a first segment and a first end portion, wherein the first segment extends along a first direction and has a first side perpendicular to the first direction, and the first end portion comprises a second side overlapping the first side and a third side, wherein the third side of the first end portion connects the second side, extends along a second direction and forms a first angle, different from the right angle, with the first direction; and
forming a second conductive line comprising a first segment extending along the second direction, wherein the first segment of the second conductive line is separated from the third side of the first end portion of the first conductive line by a first distance greater than or equal to a first design rule distance.

16. The method of claim 15, wherein the second conductive line further comprises a second segment and a third segment, wherein each of the second and third segments of the second conductive line extends along the first direction,
wherein the first segment of the second conductive line connects the second and third segments of the second conductive line together.

17. The method of claim 16, further comprising:
forming a third conductive line comprising a first segment extending along the first direction,
wherein the first segment of the first conductive line and the second segment of the second conductive line are a second distance apart, and the first segment of the third conductive line and the third segment of the second conductive line are separated from each other by a third distance, wherein the second distance and the third distance are both greater than or equal to the first distance.

18. The method of claim 15, further comprising:
forming a third conductive line that has an first end portion,
wherein a nearest pair of vertices of the first end portions of the first and third conductive lines respectively are separated by a second distance greater than or equal to the first design rule distance.

19. The method of claim 15, further comprising:
forming a via arranged on the first conductive line, wherein the via is separated from the third side of the first end portion of the first conductive line by a second distance greater than or equal to a second design rule distance.

20. The method of claim 15, wherein the first conductive line further comprises a second segment and a second end portion, wherein the second segment of the first conductive line connects the first segment of the first conductive line, extends along the first direction and has a first side perpendicular to the first direction, and the second end portion of the first conductive line comprises a second side and a third side, wherein the second side of the second end portion of the first conductive line overlaps the first side of the second segment of the first conductive line, and the third side of the second end portion of the first conductive line connects the second side of the second end portion of the first conductive line, extends along the second direction and forms the first angle with the first direction.

* * * * *